(12) United States Patent
Armstrong et al.

(10) Patent No.: US 11,300,617 B2
(45) Date of Patent: Apr. 12, 2022

(54) GROUND FAULT INTERRUPTER SELF TEST CIRCUITS AND RELATED METHODS

(71) Applicant: SEMICONDUCTOR COMPONENTS INDUSTRIES, LLC, Phoenix, AZ (US)

(72) Inventors: Bruce G. Armstrong, San Mateo, CA (US); Rishi Pratap Singh, Orem, UT (US); Sanath Kumar Kondur Surya Kumar, Sandy, UT (US); Riley Beck, Eagle Mountain, UT (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 161 days.

(21) Appl. No.: 16/458,368

(22) Filed: Jul. 1, 2019

(65) Prior Publication Data

US 2020/0041567 A1 Feb. 6, 2020

Related U.S. Application Data

(60) Provisional application No. 62/713,925, filed on Aug. 2, 2018.

(51) Int. Cl.
*G01R 31/14* (2006.01)
*G01R 31/327* (2006.01)
(Continued)

(52) U.S. Cl.
CPC ......... *G01R 31/327* (2013.01); *G01R 27/18* (2013.01); *G01R 31/006* (2013.01); *G01R 31/086* (2013.01); *G01R 31/2827* (2013.01); *G01R 31/40* (2013.01); *G01R 31/42* (2013.01); *G01R 31/52* (2020.01); *H02H 3/335* (2013.01); *H02H 3/16* (2013.01)

(58) Field of Classification Search
CPC ........ G01R 31/52; G01R 31/40; G01R 31/42; G01R 27/18; G01R 31/086; G01R 31/327; G01R 31/2827; G01R 31/3277; G01R 19/145; G01R 19/175; G01R 31/006; H02H 3/16; H02H 3/335
USPC ................ 324/500, 508, 509, 541, 544, 551
See application file for complete search history.

(56) References Cited

U.S. PATENT DOCUMENTS 8,085,515 B2   12/2011  Yugou et al.
8,085,516 B1   12/2011  Amstrong
(Continued)

OTHER PUBLICATIONS

Extended European Search Report, European Patent Application No. 19188448.5, dated Oct. 31, 2019, 8 pages.

*Primary Examiner* — Raul J Rios Russo
(74) *Attorney, Agent, or Firm* — Adam R. Stephenson, Ltd.

(57) ABSTRACT

Implementations of ground fault circuit interrupter (GFCI) self-test circuits may include: a current transformer coupled to a controller, a silicon controlled rectifier (SCR) test loop coupled to the controller, a ground fault test loop coupled to the controller, and a solenoid coupled to the controller. The SCR test loop may be configured to conduct an SCR self-test during a first half wave portion of a phase and the ground fault test loop may be configured to conduct a ground fault self-test during a second half wave portion of a phase. An SCR may be configured to activate the solenoid to deny power to a load upon one of the SCR self-test or the ground fault self-test being identified as failing.

19 Claims, 17 Drawing Sheets

(51) Int. Cl.

| | |
|---|---|
| *G01R 31/28* | (2006.01) |
| *H02H 3/33* | (2006.01) |
| *G01R 31/52* | (2020.01) |
| *G01R 31/40* | (2020.01) |
| *G01R 31/42* | (2006.01) |
| *G01R 27/18* | (2006.01) |
| *G01R 31/00* | (2006.01) |
| *G01R 31/08* | (2020.01) |
| *H02H 3/16* | (2006.01) |

(56) References Cited

U.S. PATENT DOCUMENTS

| | | | |
|---|---|---|---|
| 8,670,824 B2 | 3/2014 | Anderson et al. | |
| 2005/0212522 A1 | 9/2005 | Finlay et al. | |
| 2011/0148423 A1* | 6/2011 | Richards | G01R 31/28 324/424 |
| 2012/0257314 A1* | 10/2012 | Armstrong | H02H 3/162 361/42 |
| 2015/0309105 A1* | 10/2015 | Ostrovsky | G01R 35/00 324/509 |
| 2016/0109521 A1 | 4/2016 | Salas | |
| 2016/0363627 A1 | 12/2016 | Epee | |
| 2017/0025846 A1 | 1/2017 | Du | |
| 2018/0220541 A1* | 8/2018 | Aromin | H02H 3/16 |
| 2018/0302997 A1* | 10/2018 | Aromin | H05K 5/0247 |
| 2018/0323605 A1* | 11/2018 | Kinsel | H01H 83/04 |

\* cited by examiner

High Ground Fault Detection
Detection at powerup

Cursor=21,001,057ns
Baseline=0
Cursor-Baseline=21,001,057ns

| | | |
|---|---|---|
| | SUP | 7.2985V |
| | VDDA | 3.33837V |
| | porb | 3.3384V |
| | MLD | 3.33294V |
| | SCR | 0 |
| | saturatedB | 0 |
| | faultSat | 0 |
| | gfFault | 0 |
| | clk | 1 |
| | CTB | 1.66962V |
| | CTS | 1.29954V |
| | (CTB-CTS) | 0.370082V |

FIG. 10

GROUND FAULT INTERRUPTER SELF TEST CIRCUITS AND RELATED METHODS

CROSS REFERENCE TO RELATED APPLICATIONS

This document claims the benefit of the filing date of U.S. Provisional Patent Application 62/713,925, entitled "ALCI Auto Monitoring Circuit" to Armstrong et al., which was filed on Aug. 2, 2018, the disclosure of which is hereby incorporated entirely herein by reference.

BACKGROUND

1. Technical Field

Aspects of this document relate generally to ground fault interrupter circuits. More specific implementations involve appliance leakage circuit interrupter (ALCI) circuits.

2. Background

Ground fault interrupter circuits detect when a leakage current path exists between a supply and a ground connected to a load and act to open the circuit. Through the ground fault interrupter circuit opening the leakage current path, individuals in the path of the leakage circuit are prevented from receiving current from the supply.

SUMMARY

Implementations of ground fault circuit interrupter (GFCI) self-test circuits may include: a current transformer coupled to a controller, a silicon controlled rectifier (SCR) test loop coupled to the controller, a ground fault test loop coupled to the controller, and a solenoid coupled to the controller. The SCR test loop may be configured to conduct an SCR self-test during a first half wave portion of a phase and the ground fault test loop may be configured to conduct a ground fault self-test during a second half wave portion of a phase. An SCR may be configured to activate the solenoid to deny power to a load upon one of the SCR self-test or the ground fault self-test being identified as failing.

Implementations of GFCI self-test circuits may include one, all, or any of the following:

The circuit may be half wave biased.

One of the ground fault self-test or the SCR self-test may fail two or more consecutive times before the SCR activates the solenoid.

The circuit may be configured to periodically test one of the current transformer, the solenoid, a rectifier diode circuit, a current limiter dropping resistor, or any combination thereof.

The circuit may be configured to detect an AC zero cross condition using a phase sense circuit coupled with a half wave power supply to monitor a power supply pin current over a positive half cycle and a negative half cycle of the half wave power supply.

The circuit may be configured to detect an open condition on a power supply pin using a supply sense circuit coupled with a switch coupled with a phase pin to turn on the SCR and activate the solenoid when the supply sense circuit detects a floating condition or a no good bias condition at the power supply pin.

The supply sense circuit may include a single diode coupled with a limiting resistor where the limiting resistor is coupled with the power supply pin.

Implementations of a GFCI self-test circuit may include an SCR test loop coupled to a controller, a ground fault test loop coupled to the controller, and a solenoid coupled to the controller. The SCR test loop may be configured to conduct an SCR self-test during a first half wave portion of a phase and the ground fault test loop may be configured to conduct a ground fault self-test during a second half wave portion of a phase. An SCR may be configured to activate the solenoid and deny power to a load upon one of the SCR self-test or the ground fault self-test being identified as failing two or more consecutive times.

Implementations of GFCI self-test circuits may include one, all, or any of the following:

The circuit may be half wave biased.

One of the ground fault self-test or the SCR self-test may be repeatedly performed after the passage of a predetermined period of time while the circuit is coupled with an electrical power supply.

The circuit may be configured to periodically test one of a current transformer, the solenoid, a rectifier diode circuit, a current limiter dropping resistor, or any combination thereof.

The circuit may be configured to detect an AC zero cross condition using a phase sense circuit coupled with a half wave power supply to monitor a power supply pin current over a positive half cycle and a negative half cycle of the half wave power supply.

The circuit may be configured to detect an open condition on a power supply pin using a supply sense circuit coupled with a switch coupled with a phase pin to turn on the SCR and activate the solenoid when the supply sense circuit detects a floating condition or a no good bias condition at the power supply pin.

The supply sense circuit may include a single diode coupled with a limiting resistor where the limiting resistor is coupled with the power supply pin.

Implementations of GFCI self-test circuits may employ various implementations of a method of self-testing a GFCI circuit. Method implementations may include consecutively testing for a ground fault in a GFCI circuit during a first half wave portion of a phase, consecutively testing an SCR in the GFCI circuit during a second half wave portion of the phase, and placing the GFCI circuit in an end of life stage if one of testing for the ground fault or testing the SCR results in consecutively failed tests.

Implementations of a method self-testing a GFCI circuit may include one, all, or any of the following:

The testing for the ground fault and the testing of the SCR may occur within a second of powering the GFCI circuit.

The testing for the ground fault and the testing of the SCR may be completed within five seconds of powering the GFCI circuit.

The method may further include placing the GFCI circuit in the end of life stage if one of testing a current transformer, the solenoid, a rectifier diode circuit, a current limiter dropping resistor, or any combination thereof results in a failed test.

The method may further include detecting an AC zero cross condition using a phase sense circuit coupled with a half wave power supply to monitor a power supply pin current over a positive half cycle and a negative half cycle of the half wave power supply.

The method may further include detecting an open condition on a power supply pin using a supply sense circuit coupled with a switch coupled with a phase pin to turn on the SCR and activate a solenoid when the sense circuit detects a floating condition or a no good bias condition at the power supply pin.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 10 is a plot of various waveforms illustrating an ALCI circuit detecting a saturation ground fault condition on power-up;

DESCRIPTION

This disclosure, its aspects and implementations, are not limited to the specific components, assembly procedures or method elements disclosed herein. Many additional components, assembly procedures and/or method elements known in the art consistent with the intended ground fault interrupter circuits and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such ground fault interrupter circuits, and implementing components and methods, consistent with the intended operation and methods.

UL943B is an industry standard governing appliance leakage current interrupter (ALCI) circuits promulgated by Underwriters Laboratories. The new UL943B, which is scheduled to go into effect in February of 2020, implements an automatic monitoring standard for ALCI circuits. The standard requires periodic testing of key components of the ALCI application circuit, such as the current/sense current transformer, silicon-controlled rectifier (SCR), ground fault sensing controller, solenoid, rectifier circuit, current limiter dropping resistor, and other passive components. UL943B requires that the circuit be self-tested within 5 seconds of AC power up and that the self-test repeat itself within 15 minutes. Various implementations of ALCI circuits disclosed herein may comply with the UL943B industry standard scheduled to go into effect February of 2020.

While various implementations of ALCI circuits are disclosed in this document, ALCI circuits are a specific use case of ground fault circuit interrupter (GFCI) circuits. In a GFCI circuit, the controller and other circuit components are designed to detect when a ground fault condition in the circuit/load to which the GFCI device is coupled exists. A ground fault condition is when electrical current in the circuit/load is permitted to go directly to ground through a path other than the designed one. Since this path can be through a person holding the load (appliance) in the case of an ALCI circuit, electrical safety requirements have created ALCI circuits to detect when a ground fault condition exists and, as a function of the detected ground fault current, open the circuit to prevent current flow. In this way, electrical safety and the risk of electrocution can be reduced. The various principles disclosed in this document can be applied to many types of GFCI circuits, including ALCI circuits.

Figure 1:
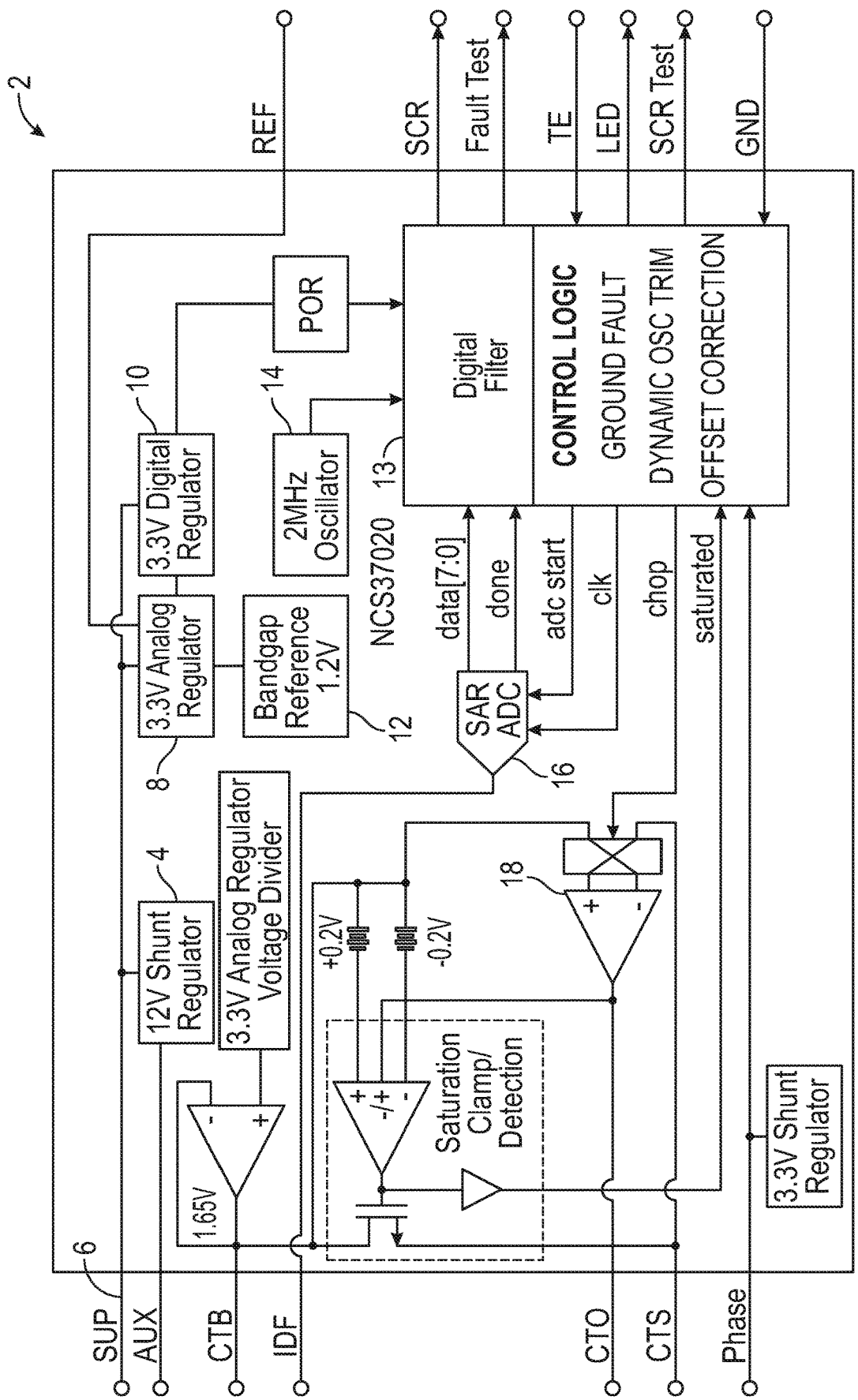
FIG. 1 is a block diagram of the internal structure of a ground fault circuit interrupter (GFCI)/appliance leakage current interrupter (ALCI) controller.

Referring to FIG. 1, a block diagram of an ALCI controller 2 implementation is illustrated. As illustrated, controller includes a shunt regulator 4 coupled to a power supply (supply) pin 6. In various implementations, the shunt regulator 4 may be set to regulate the voltage from the supply at 12 V, however, in other implementations the shunt regulator 4 may be designed to set the voltage from the supply to more or less voltage than 12 V. In various implementations, the shunt regulator 4 may clamp the supply (SUP) pin voltage at 12 V (or any other set voltage). The shunt regulator 4 may also provide the bias voltage for the analog and digital internal circuitry via two linear regulators 8, 10.

As illustrated, the two linear regulators, one regulator for the digital circuit 10 and the other regulator for the analog circuit 8, may be 3.3 V linear regulators in various implementations. While the linear regulators are illustrated as being a 3.3 V linear regulators, in various implementations the linear regulator may be set to more or less voltage than 3.3 V. In particular implementations, the linear regulators may be a low drop out linear regulators. As illustrated, the analog linear regulator 8 may be coupled to a precision band gap reference voltage source 12. As illustrated, the precision bandgap reference voltage source 12 is set to 1.2 V, however, in other implementations the bandgap reference may be set to more or less than 1.2 volts. The linear regulator(s) and the bandgap reference voltage source 12 may both be coupled a digital filter 13 in various implementations.

In various implementations, the controller may also include an oscillator 14 coupled to the digital filter 13. The oscillator 14 may be dynamically trimmed to the AC line frequency, meaning the oscillator is capable of shifting based on the detected AC line frequency. In various implementations, the oscillator 14 may be a 2 MHZ oscillator coupled to the digital filter. The controller may also include a successive approximation register (SAR) analog to digital converter (ADC) 16 coupled to the digital filter. In various implementations the SAR ADC 16 may be an 8 bit device, while in other implementations the SAR ADC may be more or less than 8 bits. In other implementations, however, an ADC that is another type other than SAR ADC may be utilized. The controller may include a sense amplifier 18, or current transformer amplifier which may include Vos dynamic cancellation. The current transformer amplifier 18 may include a 1.65 V reference, however, in other implementations the reference may be more or less than 1.65 V. The controller also includes other various control logic used to perform and analyze the various tests carried out by the controller. Various other additional pins may be included on the controller, which may take the form of a single semiconductor die in a package with pins and/or leads in various implementations. In various implementations disclosed in this document, phase sensing circuits and power supply (supply) sensing circuits may also be implemented to implement further testing and checking of the controller and system components.

Figure 2:
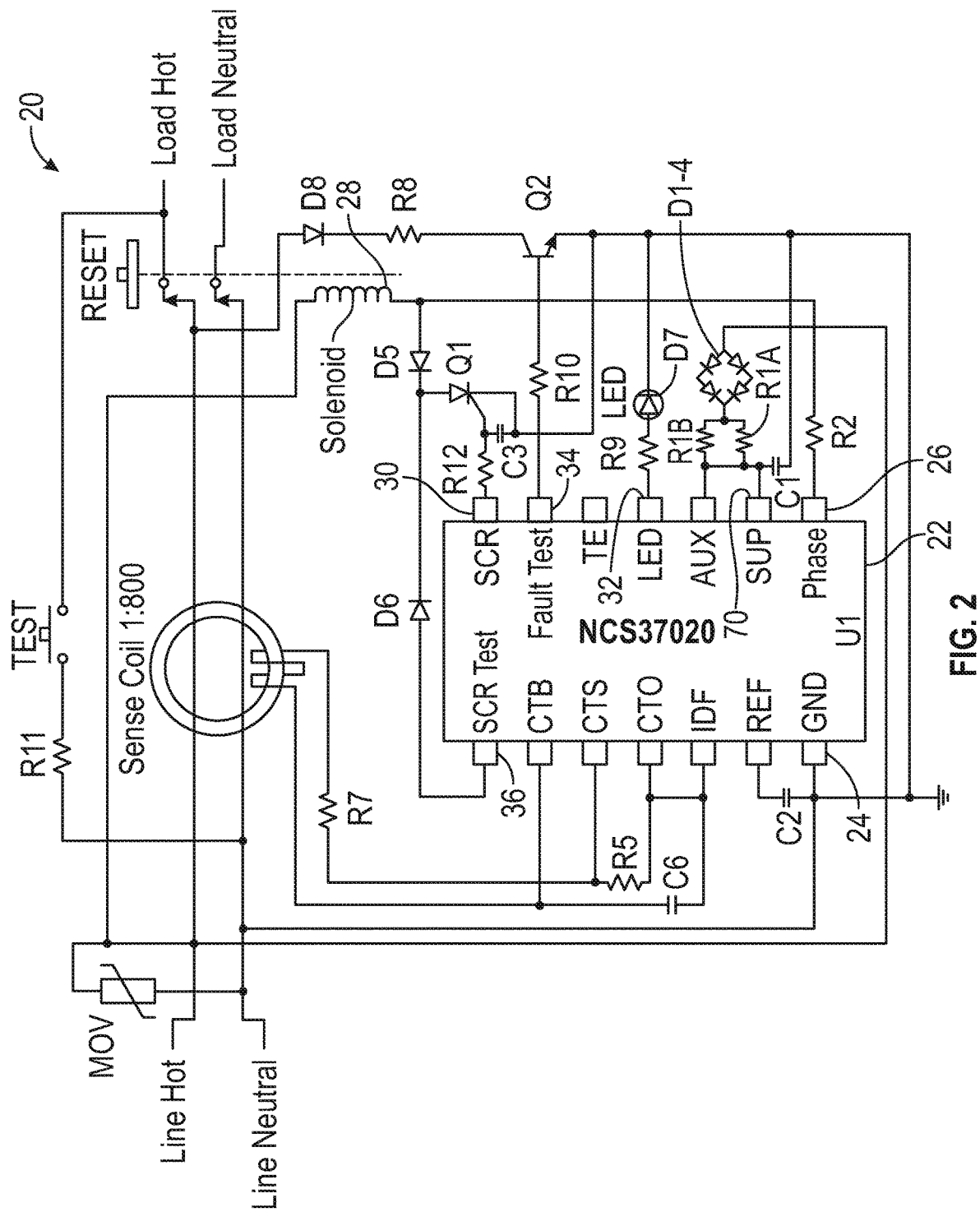
FIG. 2 is a schematic of an GFCI circuit designed for ALCI operations.

Referring to FIG. 2, an ALCI circuit implementation (GFCI circuit) 20 is illustrated. The ALCI circuit 20 includes a controller 22 which may the same as or similar to the controller 2 illustrated in FIG. 1. The controller 22 can be biased either half wave or full wave in various implementations. As illustrated by FIG. 1, this controller 22 is biased half wave using a half bridge D1-D4. In this implementation, the ground pin 24 is coupled directly with the Line Neutral. Because the controller 2 is biased half wave, it may be coupled to lower wattage bias resistors (R1A and R1B) and less redundant bias diodes. Diodes D1-D4 may be biased so that only during the positive half cycle will the supply capacitor C1 be charged while the controller is being powered by the power supply/AC mains (main)/Line Hot. During the negative half cycle, C1 supplies the bias current/supply for the controller 22, making the controller biased half wave. In various implementations, in order to minimize the controller's bias current during the negative half cycle so as to not reset the controller, the silicon controlled rectifier (SCR) output 30 and LED output 32 may only be enabled during the positive half cycle. In various implementations, diodes D1-D4, resistors R1A-R1B, or both diodes D1-D4 and resistors R1A-R1B may include redundant components. In particular implementations, these redundant components may comply with the UL943B standards.

Figure 15:
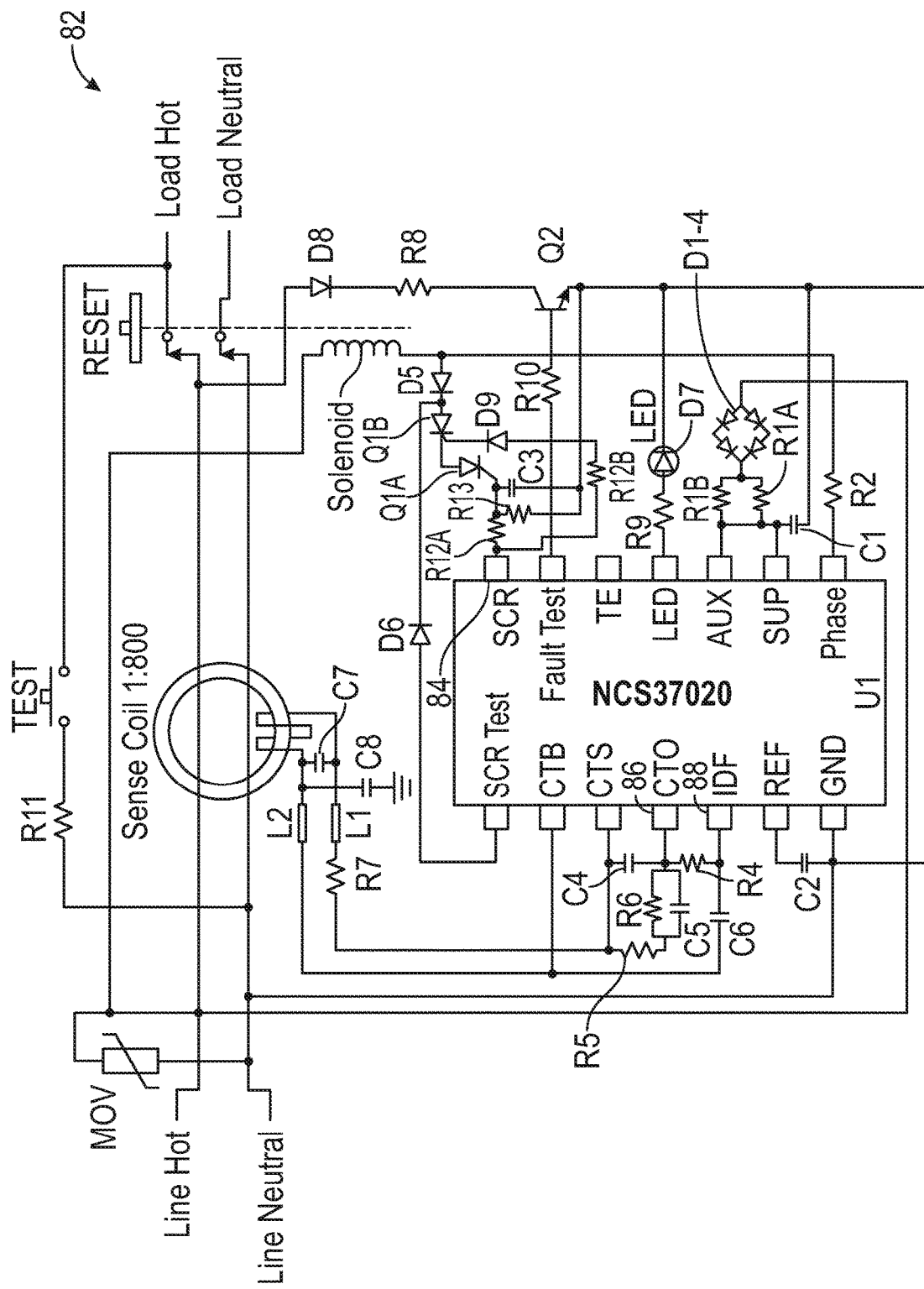
FIG. 15 is a schematic of another implementation of a GFCI circuit designed for ALCI operations.

In various implementations, the ALCI circuit 20 may be designed to run two or more tests which test the functionality of one, all, or any of a plurality of components in the ALCI circuit. In a particular implementation, the ALCI circuit 20 may be configured to run at least a ground fault self-test (to test at least the function of the current transformer) and an SCR self-test. In a particular implementation, these two self-tests may test all of the critical components listed in UL943B, including testing the current transformer (or sense coil), testing the solenoid, testing the phase input, testing the SCR which is onboard the controller 20 (or a separate component coupled with the controller 20 in various implementations), and testing the bias circuitry. In other implementations, more than two tests may be run in order to test all of the critical components of UL943B. Referring to FIG. 15, another implementation of a GFCI circuit 82 is illustrated. In this implementation, two SCRs Q1A and Q1B are illustrated coupled to the SCR pin 84 with various additional circuitry to allow redundant SCR Q1B to operate in the event of a failure of SCR Q1A. Also in circuit 82, resistor R4 is present between the CTO pin 86 and the IDF pin 88 to provide extra filtering compared with the ALCI circuit 20 illustrated in FIG. 2. The implementation of FIG. 15 may function similarly to that of FIG. 2 with respect to utilizing any of the various methods of self-testing and operation disclosed herein.

In various implementations, prior to running the ground fault self-test, the phase pin 26 of the controller 20 may continually be checked for an input signal. If there is no signal detected on the phase pin 26 for a predetermined amount of time due to an open solenoid 28 or open R2 resistor, a "no phase" end of life (EOL) fault will occur. After a predetermined amount of time, the LED indicator logic in the controller 20 will be enabled and will cause the LED to blink on the ALCI circuit device, indicating to the user that the device is no longer functional and needs to be replaced. In the meantime, the controller 20 will keep the circuit in which the ALCI circuit device is connected open and unable to deliver current for safety reasons.

In various implementations, the SCR output 30 may be enabled for one positive half cycle every four seconds in the event of a self-test failure. The "no phase" end of life (EOL) logic state will continue until a power on reset occurs or an AC zero cross signal is detected at the phase pin 26. When a signal is detected, the no phase EOL state will be reset and a self-test cycle will occur. In various implementations, if this self-test cycle passes it may repeat itself after a predetermined period of time. In various implementations, the self-test counter may be preset at twelve for this state so if four consecutive self-test cycles fail, a self-test EOL fault will occur. During a no phase EOL state, the phase information may be detected by the shunt regulator's bias circuitry internal to the controller 20. A non-limiting example of such circuit may be found in FIG. 11 and the related disclosure in this document. In various implementations, the shunt regulator may detect an AC zero cross and negative half wave by monitoring the shunt regulator's clamp current. In various implementations, when the VAC voltage is below about 30 volts, an AC zero cross is registered by the shunt regulator's circuitry. As will be discussed further in this document, the ability of the shunt regulator to detect an AC zero cross condition using the clamp current may allow for the elimination of the phase pin 26 in various controller implementations.

In various implementations, the ALCI circuit may also run a ground fault test. In particular implementations, the ground fault test may be run before or after the SCR test or any other test. The ground fault test tests the ability of the controller 20 to recognize a differential current fault. During the ground fault self-test, the fault test pin 34 may be asserted for at least a portion of (and in other implementations, a majority of) the positive phase cycle. During this time, switch Q2 illustrated in FIG. 2 may be closed, creating a loop as well as a ground fault. If the controller can observe the ground fault, which in various implementations is represented as an over 5 mA differential current, then the ground fault self-test may be judged as passed and the results recorded in memory associated with or included in the controller 20. If the ground fault is not detected, the failed test is recorded in the memory. Because the ground fault test utilizes the ground fault test loop illustrated in FIG. 2, the test can be performed without disabling the ground fault detection circuit. Further, the ground fault test is conducted without tripping the load contacts or denying power to the load.

In addition to the ground fault test, the ALCI circuit may run an SCR test of the SCR onboard the controller 20. During a negative half cycle, in a particular method implementation, the SCR's anode voltage may be pre-biased by the SCR Test pin 36 to 3.3 volts. The SCR is then enabled and the SCR's anode voltage is then monitored by the SCR Test pin 36. When the SCR is enabled, an SCR test loop runs from the SCR test pin 36, through diode D6, through the SCR and to the SCR pin 30. When the SCR is asserted high by the controller 20 the SCR Test pin 36 is expected to go low shortly thereafter. If the signal at the SCR Test pin 36 does go low, a pass may be recorded for this test in the memory by the controller 20. The SCR Test pin 36 is also checked before the actual test to make sure that the signal at the SCR Test pin 36 is pulled high by the pre-bias. If the anode voltage of the SCR goes below a predetermined number of volts (in particular implementations, 2.3 V), the SCR may be immediately disabled by the controller and the self-test logic may register a passing self-test cycle. In various implementations, a blocking diode D5 may be adjacent to the SCR test loop. In such implementations, the blocking diode D5 will prevent the solenoid 28 from being energized and opening the load contacts during the application of the bias. Because of this, the SCR self-test may also be performed without tripping the load or denying power to the load.

Figure 3:
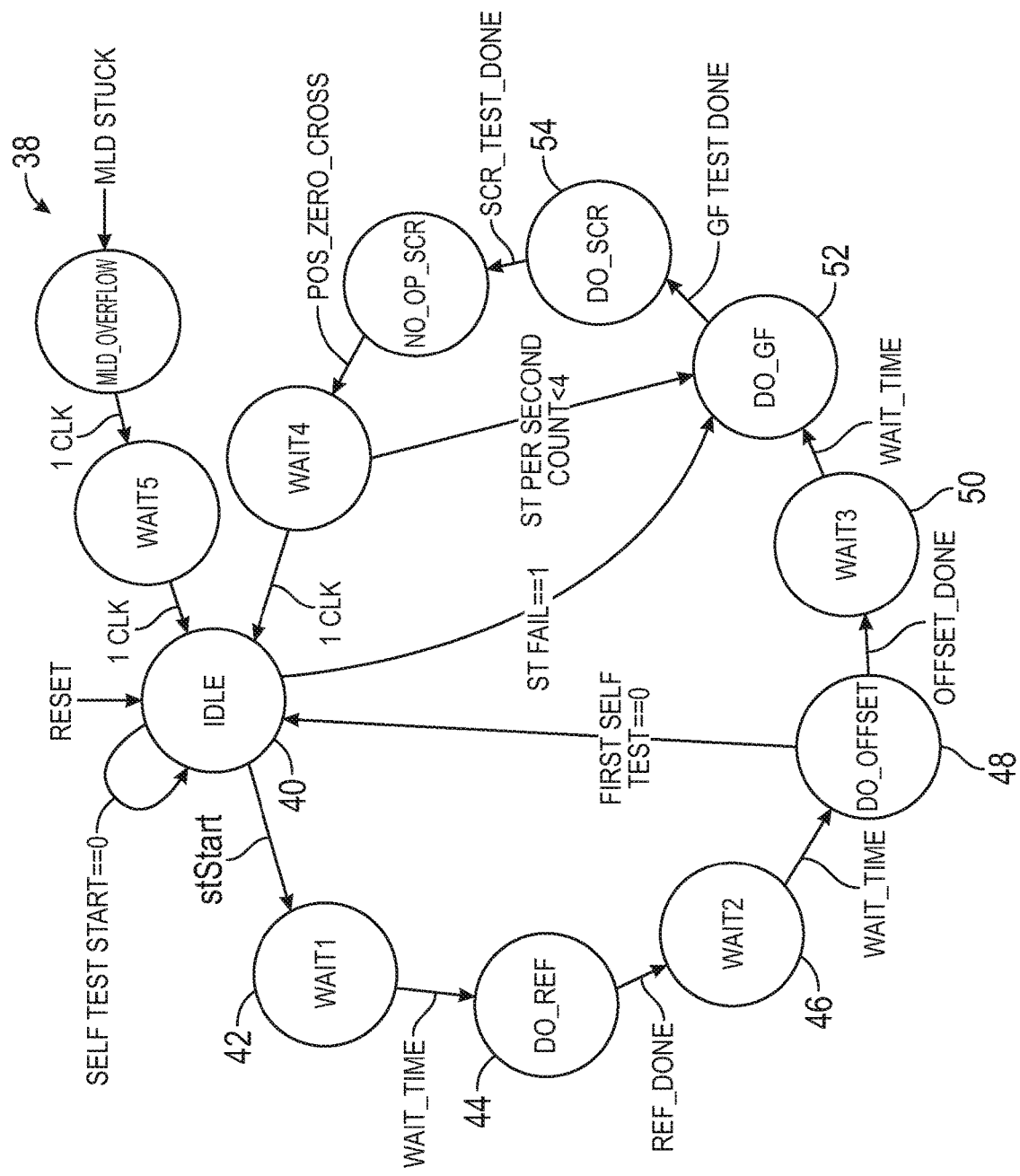
FIG. 3 is a digital circuit state machine diagram for an ALCI circuit.

Referring to FIG. 3, a diagram of a digital circuit state machine 38 for the ALCI circuit is illustrated. Moving left from the IDLE block 40, the first five blocks 42, 44, 46, 48, 50 all occur before the ground fault and SCR self-test are performed. These blocks include steps such as trimming the reference voltage and other functions used to set up the SAR ADC for its work in performing the various self-test operations. In various implementations, the ground fault test and the SCR test are performed within a second of powering up the circuit. In other implementations, the ground fault test and/or SCR test could occur in less than a second or more than a second from powering up the circuit (but no more than about 5 seconds). Represented by the block DO_GF 52, the circuit performs a ground fault self-test using any method disclosed herein. If the ground fault test passes, the test may then be repeated after a predetermined interval of time. In various implementations, the repeat test interval is within 15 minutes. In a particular implementation, the ground fault test is scheduled to reoccur every 12 minutes. In other implementations, the ground fault self-test may occur more often than this when the ground fault self-test is passed. The "stStart" process in the state machine is triggered to start the test sequence based off the 12 minute timer (or other predetermined time) or if the self-test fails it may be subsequently triggered every 1 second until the circuit passes or finally fails the ground fault test. Alternatively, the "stStart" may be triggered based off a signal from the power on reset (POR) module on board the controller.

In various implementations, the SCR test may be conducted immediately following the ground fault test as previously described herein (illustrated by block DO_SCR 54).

If either the ground fault test or the SCR test fails, an EOL fault may occur and the ALCI circuit may then open the circuit and deny power to the load. In various implementations, this may be accomplished by firing the SCR consecutively with respect to the phase cycle in order to open up the solenoid and deny power to the load. In particular implementations, the SCR may be fired four consecutive times to ensure that the solenoid opens and the circuit opens, stopping the flow of power through the circuit to any device(s) coupled to the power source.

In various implementations, the EOL fault may occur after a single ground test or SCR test fail. In other implementations, if either the ground test or SCR test fails, the SCR test and/or the ground fault test may be immediately repeated (or repeated after passage of a predetermined wait time) following the failed SCR test, as indicated by FIG. 3. The tests may be repeated for up to two, three, four, five, or more than five additional cycles. In a particular implementation, the test is repeated for three more consecutive cycles. However, in other implementations, the tests may not be repeated. If any consecutive ground fault and SCR tests pass, the self-test logic will register a passing self-test cycle. In a particular implementation, if all four self-test consecutive cycles fail, a self-test cycle will be repeated at 2, 3 and 4 seconds for a total of 16 self-test cycles. If all sixteen self-test cycles fail, a self-test EOL fault will be registered and the solenoid opened.

In various implementations, the SCR may be enabled for one positive half cycle every 4.5 seconds. A self-test cycle may occur every second in various implementations. If a self-test cycle passes, the self-test EOL logic may be reset (power on reset state). If a ground fault is detected during a self-test EOL state, the EOL logic will be reset. This may allow for resetting the self-test EOL state by the user pressing the manual test button when the load contacts are closed. In implementations complying with UL943B, the ground fault self-test must be concluded within 5 seconds of powering the ALCI circuit. In implementations disclosed herein, the ground fault test and/or SCR test may be repeated up to sixteen times in four seconds before the EOL fault occurs. By allowing the user to use the manual test button and then repeating the tests, the reliability of the tests may be improved as it could then be determined if the failed test was due to a random noise glitch or was actually a failed ground fault and/or SCR self-test. This may allow the user to confirm that the ALCI device is actually defective.

In various implementations, if the controller is biased as full wave, (i.e. the ground pin 24 is not connected to the Line Neutral), then the self-test process previously described may remain the same.

Figure 4:
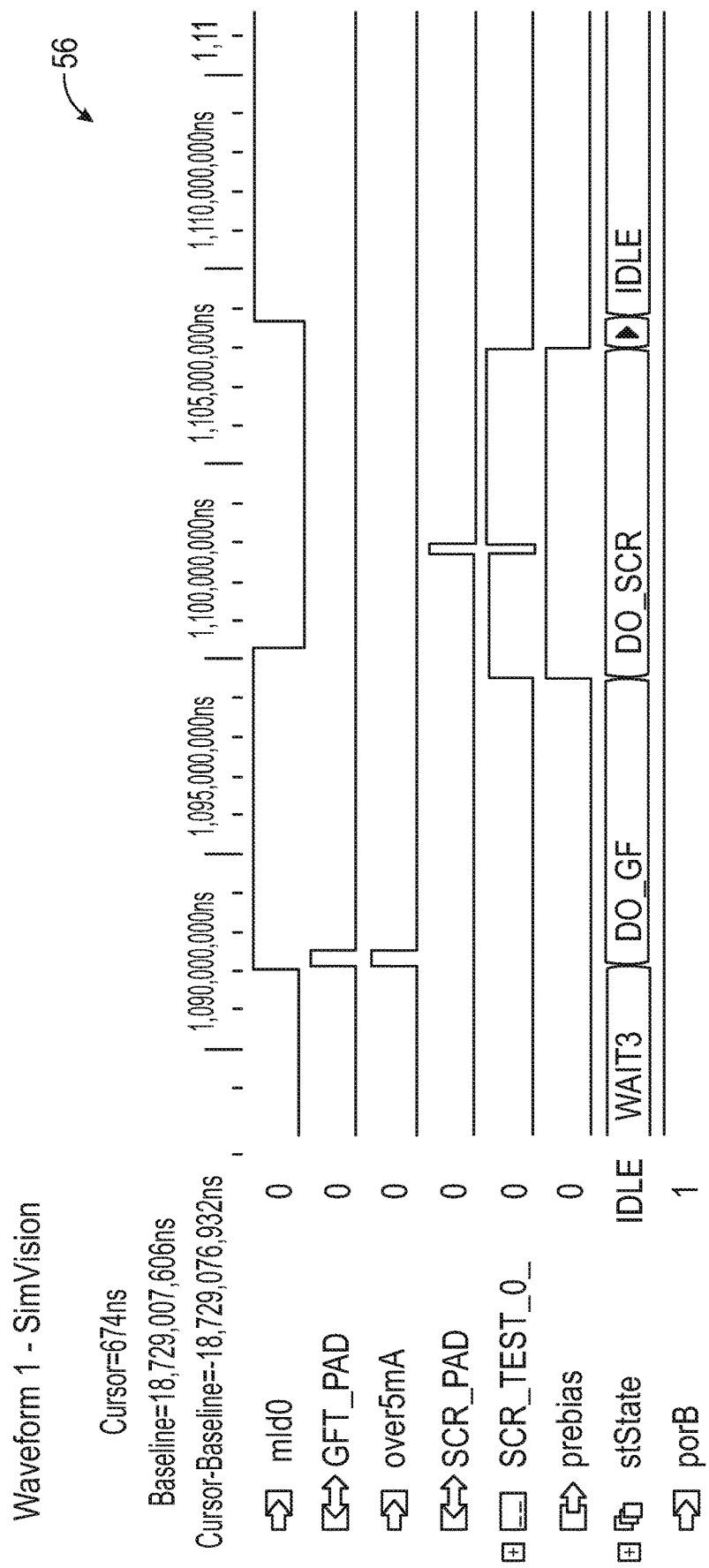
FIG. 4 is a plot of various waveforms illustrating a self-test of an ALCI circuit for a ground fault.

Referring to FIG. 4, a plot of the various waveforms 56 applied to the various controller pins while performing the self-test for a ground fault is illustrated. As illustrated by FIG. 4, the ground fault self-test occurs at one second after power up.

Figure 5:
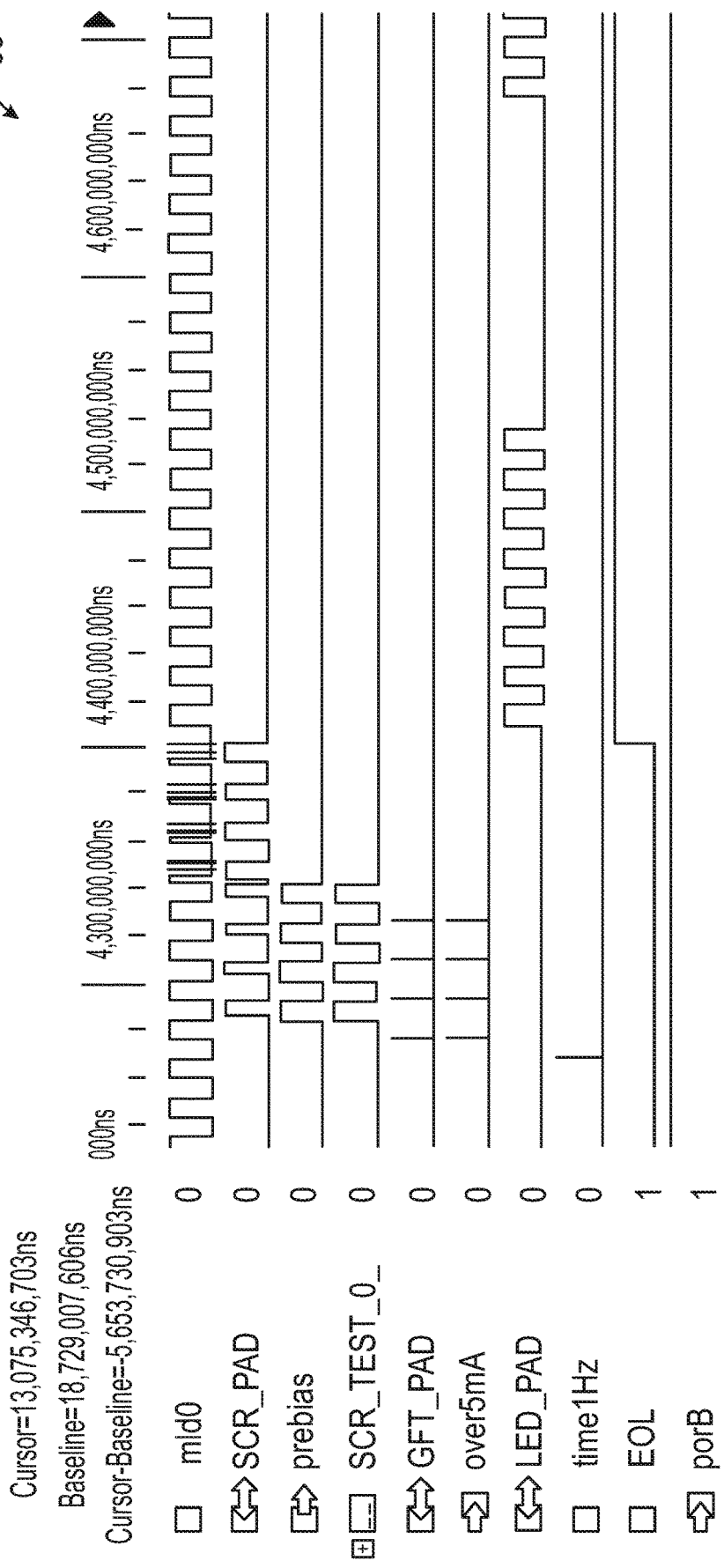
FIG. 5 is a plot of various waveforms illustrating a failing self-test for an ALCI circuit.

Referring to FIG. 5, a plot of the various waveforms 58 for a failing self-test is illustrated. In various implementations disclosed herein, a failing self-test can trigger a continuous self-test checking event occurring on following phase cycles consecutively for a total of 4 times followed by 4 checks again every 1 second. If the memory records 16 consecutive failures in 4 seconds in total (4 times every 1 second) then the controller may enter an EOL state triggering the SCR to open up the load contacts and for the LED to light (see the movement of the EOL waveform followed by the movement of the LED_PAD waveform). To ensure that the load contacts definitely open up, the SCR may be consecutively fired 4 times during the positive half of the phase cycle. In various implementations, the number of tests and the timing of the tests may vary within the 5 second window established by the standards—only one test may be performed with no repetitions, or more repetitions of each test may be performed at any desired time interval within the 5 second window.

Figure 6:
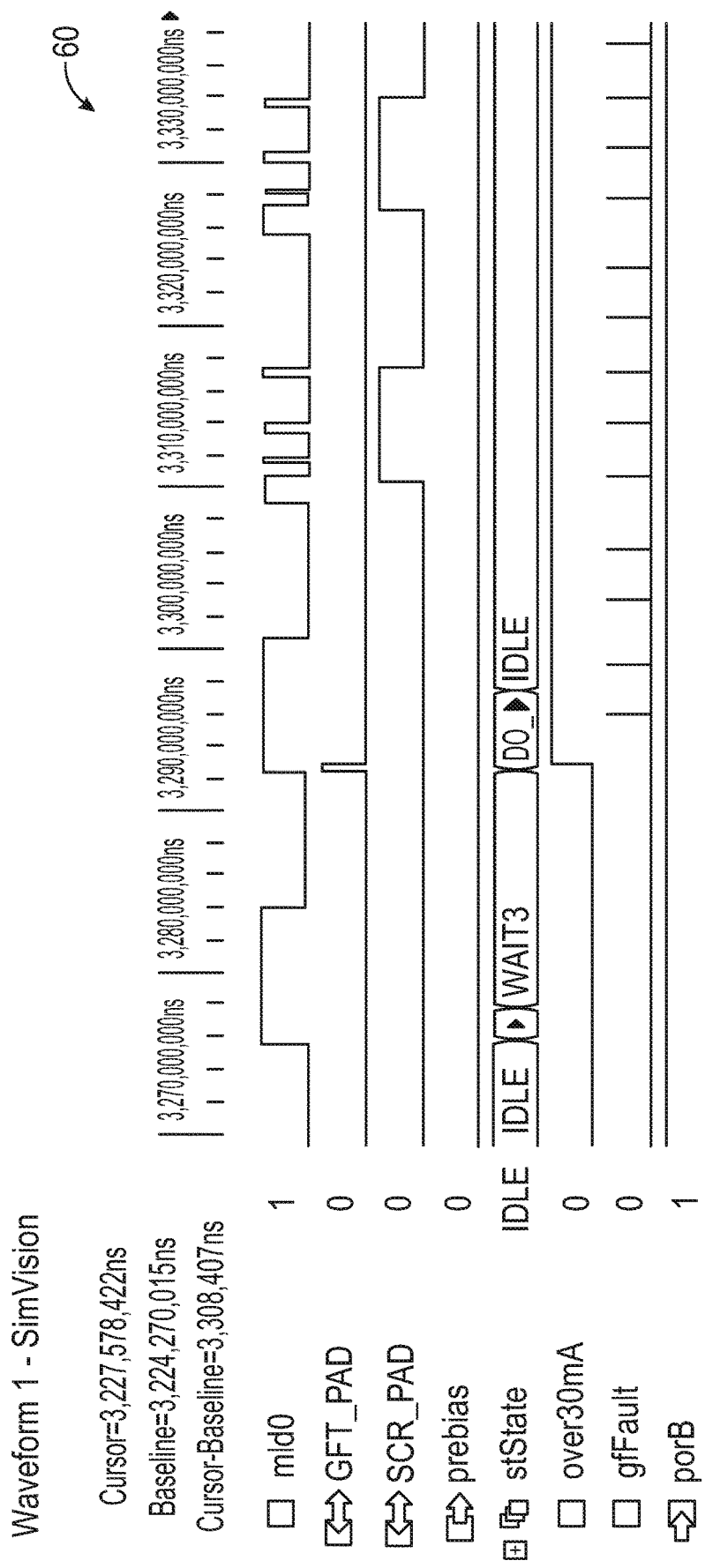
FIG. 6 is a plot of various waveforms illustrating detection of a ground fault condition during a self-test.

Referring to FIG. 6, a plot of the various waveforms 60 of a ground fault detection process during a self-test is illustrated. During a self-test, if there is a saturation current condition detected or, in a particular implementation, a 30 mA ground fault, the controller may detect it immediately, abandon the self-test, and proceed to fire the SCR as shown in FIG. 6 (see the beginning of the gfFault signals during the DO_process). A saturation current condition exists when a predetermined maximum value or more of ground fault current exists in the circuit, saturating the ability of ALCI circuit to handle the detected current. Therefore, the purpose of the immediate abandonment of the test is to short the current transformer and protect the ALCI circuit from damage from the current while at the same time working to open the circuit in which the ALCI circuit is coupled to protect the persons/equipment in the circuit from electrocution or damage because of the high detected current level. As illustrated, the self-test mechanism is half way through its procedure when a 30 mA ground fault is detected. The state machine immediately goes to idle and the SCR is subsequently fired during the positive half of the phase cycle to disconnect the ALCI circuit from power [and any device(s) connected to power through the ALCI circuit as well]. In various implementations, 5 mA and 15 mA ground faults may be rejected during self-tests.

Figure 7:
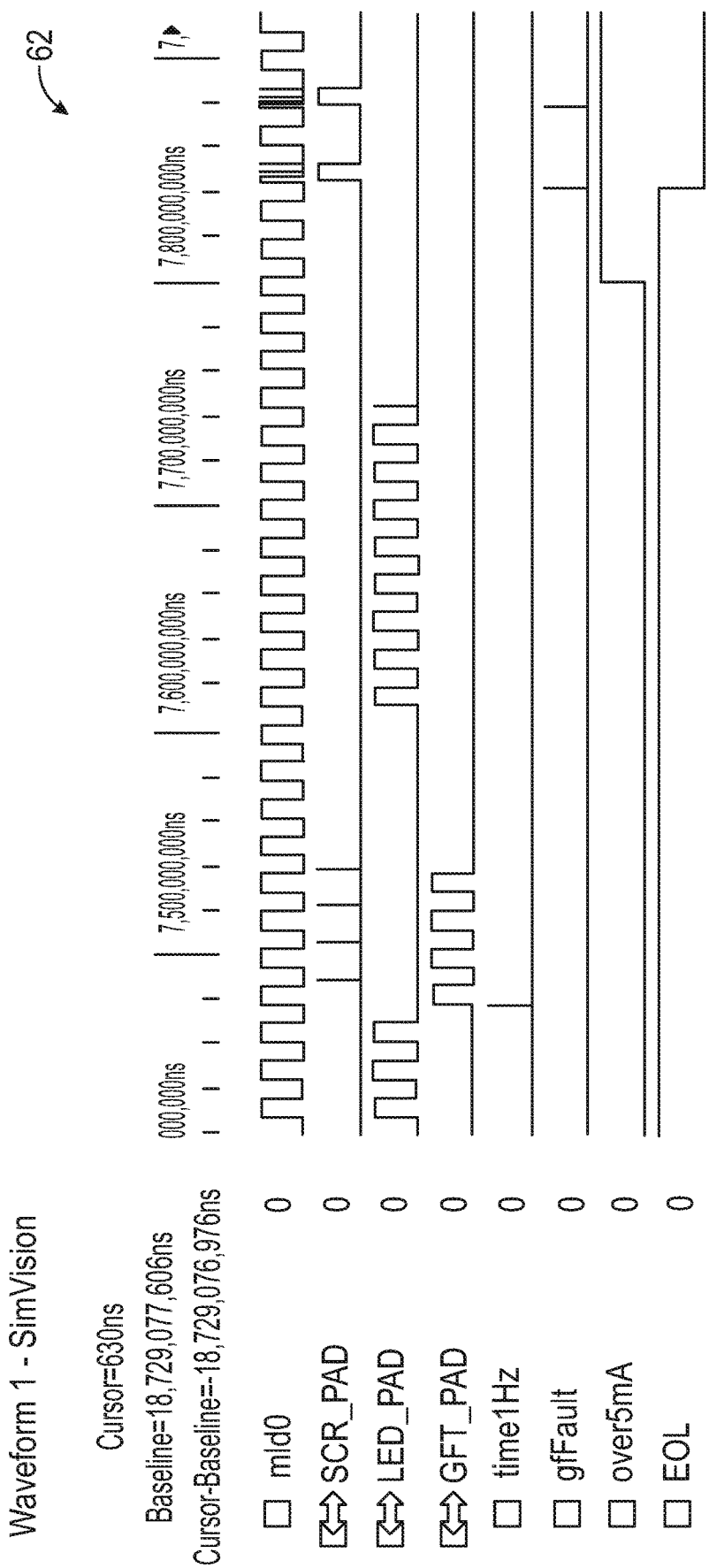
FIG. 7 is a plot of various waveforms illustrating an ALCI circuit exiting an EOL stage.

Referring to FIG. 7, is a plot of various waveforms 62 of a circuit when exiting the EOL stage is illustrated. As illustrated, when the circuit is in the EOL stage, the SCR consecutively fires 4 times with respect to positive cycle of the phase and the LEDs indicating the EOL state light/start blinking. At this point of time a POR or a ground fault may bring the part out of the EOL state. The ground fault may act as a soft reset to the circuit. In other implementations, the Test button on the ALCI device may be depressed to initiate the transition out of the EOL state. The waveform illustrated by FIG. 7 shows the introduction of a 5 mA ground fault during EOL, the detection of fault, and the controller coming out of EOL resulting in firing of the SCR.

Figure 8:
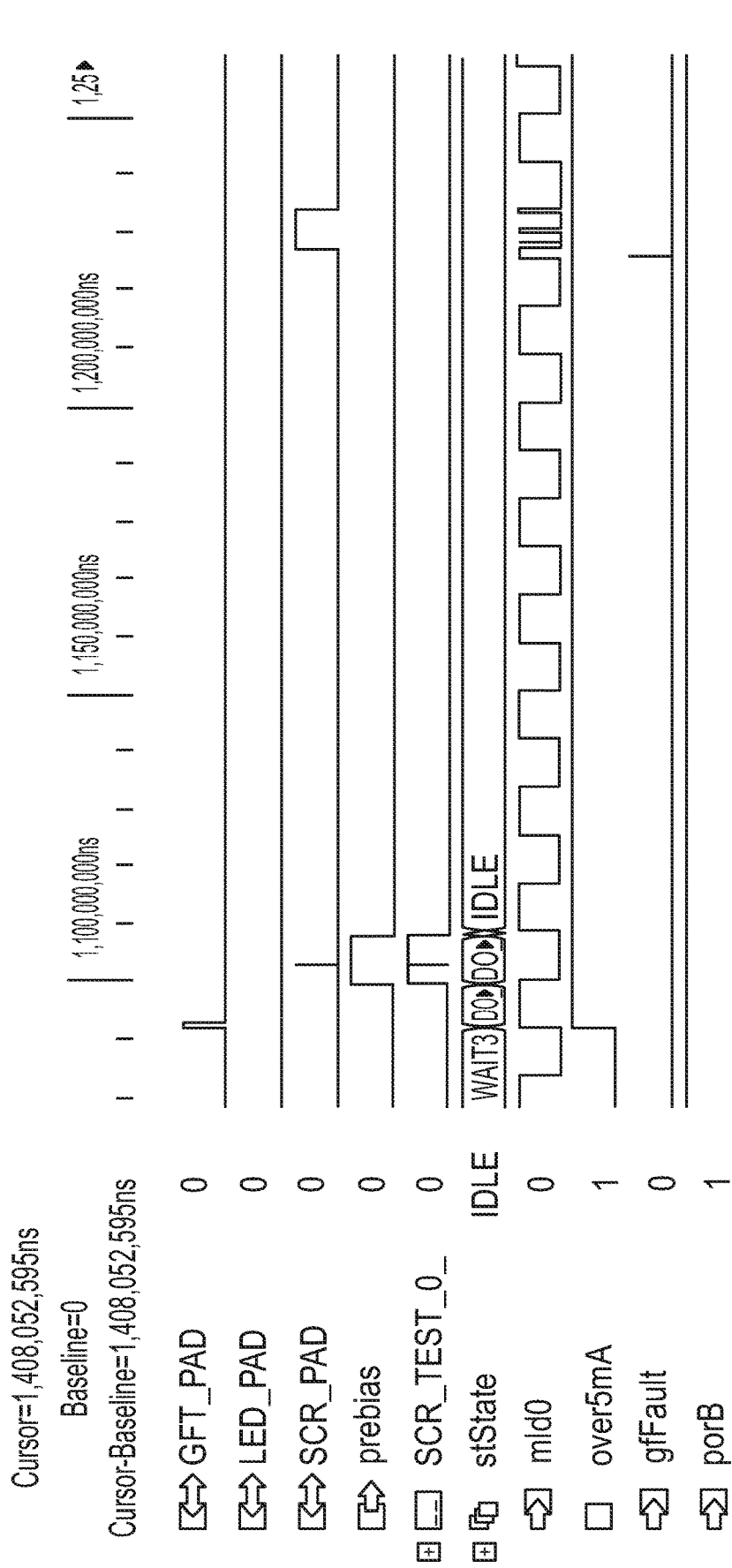
FIG. 8 is a plot of various waveforms illustrating an ALCI circuit demonstrating noise immunity/resistance during a self-test.

Referring to FIG. 8, a plot of various waveforms 64 showing noise immunity during a self-test is illustrated. In various implementations, detection of a 5 mA ground fault may be muted during and/or after the self-test for a few successive phase cycles. The 15 mA ground fault may be rejected during a self-test cycle and also for one phase cycle after the self-test. The 5 mA ground fault may be rejected during the self-test cycle and for seven phase cycles after the self-test. The diagram below shows a 5 mA ground fault which occurs during self-test and persists some time. As illustrated, the SCR is not fired for seven phase cycles and if the fault persists (genuine fault), the SCR is then then be fired immediately.

Figure 9:
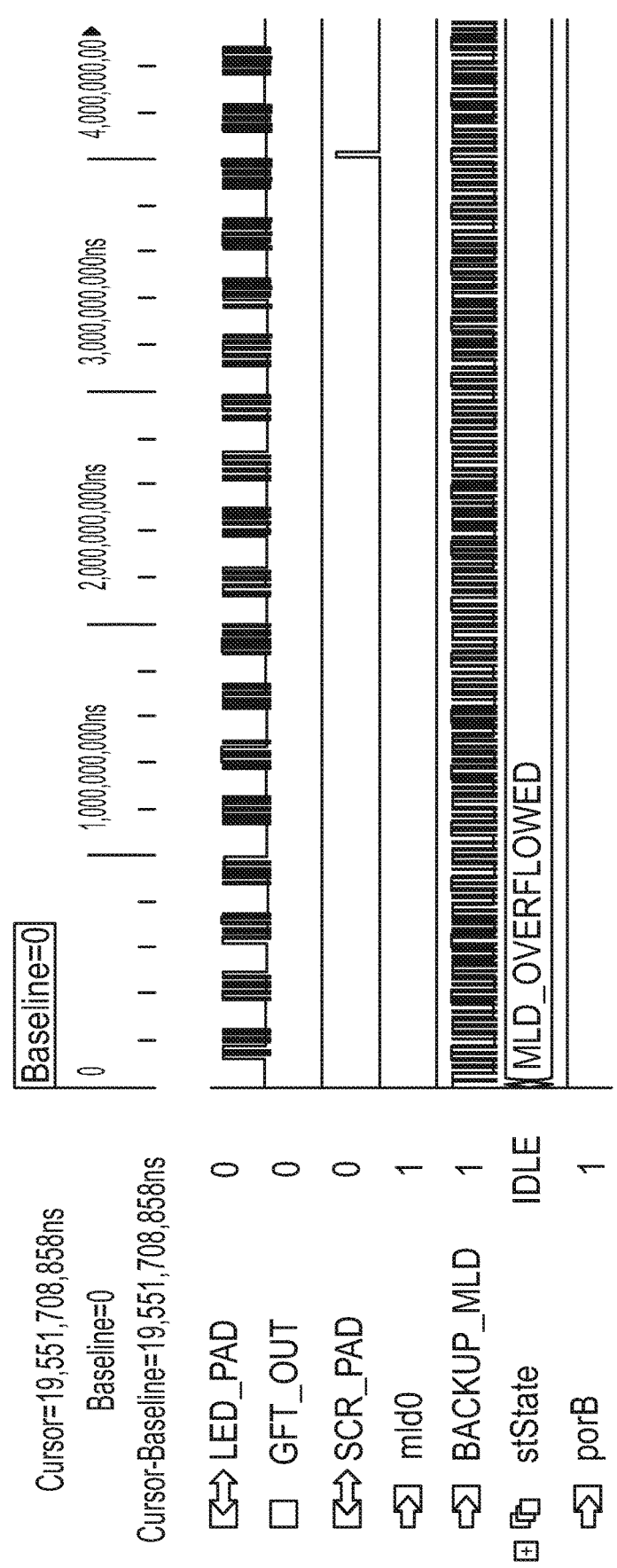
FIG. 9 is a plot of various waveforms illustrating an ALCI circuit lacking a signal at a phase pin.

Referring to FIG. 9, a plot of various waveforms 66 of a circuit lacking a signal at the phase pin is illustrated. In various implementations, if the circuit is continuously monitoring the phase pin and if there are no transitions on the phase pin for approximately 30 ms, the controller may enter an EOL state where the LED starts blinking and the SCR is fired every 4 seconds for one-half internal signal back-up phase cycle (positive cycle). This is different from entering the EOL due to a failed self-test. The LED blinking and SCR firing are now based off a back-up phase signal. The back-up phase signal is created using the line current entering the supply pin of the controller. In various implementations, there may be a current sense circuit internal to the controller that mirrors the current entering the supply pin and compares the current with an internal current reference in the controller to create the internal back-up phase signal.

Referring to FIG. 10, a plot of various waveforms 68 of a circuit that detects a saturation ground fault on power-up is illustrated. In various implementations, when a circuit is powered up in the positive half of a phase cycle and a saturation ground fault is detected, the SCR may be fired immediately based on the fact that the power up is in the positive half of phase cycle. In such implementations, this ensures that the SCR fire happens well within the required time. After the first SCR fire, the subsequent fires may happen in the usual fashion during the positive half of phase cycles.

In various ALCI circuit implementations disclosed herein the phase pin of the controller may be used to conduct AC zero cross detection. In such implementations, the use of the AC zero cross detection to time the assertion/activation of the SCR gate to send the signal to the solenoid to open the load contacts of the device and trip the device may be key to prevent wear out of the SCR. In various implementations, the timing of the AC zero cross detection may be carried out by weighting the differential trip level based on the AC main location relative to the device. In other implementations, as previously discussed, the internal oscillator may be ratiometrically trimmed based on the AC main frequency. In still other implementations, the AC zero cross detection may involve level detection of the AC main frequency.

In various implementations where a half wave power supply is used to power the controller, the AC zero cross detection may be carried out by observing the shunt regulator. During the positive half cycle (and referring to FIGS. 1 and 2), the 12 V shunt regulator 4 is enabled which clamps the current to ground. During the negative half cycle the diodes D1-4 prevent the current from discharging the stored charge in C1. This behavior can be used by the controller to identify the AC zero cross point at the point that the shunt regulator first engages to clamp the current to ground. By using the shunt regulator to identify the AC zero cross point, the timing of assertion/activation of the SCR gate may be accurately determined.

Under the UL943/943B standards, more than one redundant way to detect the AC zero cross point may needed as this point is used to time when the SCR will be fired (which ultimately determines when the ALCI circuit will trip). Accordingly, referring to FIG. 2, if R2 was missing/defective in the line to the Phase pin 26, creating an open, the controller 20 may be designed to carry out AC zero cross detection using the signal on the power supply pin (SUP) 70 supplied by the half wave power supply/half wave rectified AC power supply. In various implementations, however, the ability to use the signal on the power supply pin 70 may allow for elimination of the Phase pin 26 entirely. This is enabled because the voltage experienced by the power supply pin fluctuates in sync with the fluctuation of the phase of the power being supplied by the half wave power supply. Because the shunt regulator is coupled with the power supply pin 70, a circuit that independently observes the behavior of the shunt regulator itself can detect the AC zero cross point just as observing the signal from the phase pin. In various implementations, a phase sensing circuit is used to observe the voltage experienced by the power supply pin and determine that particular time.

Figure 11A:
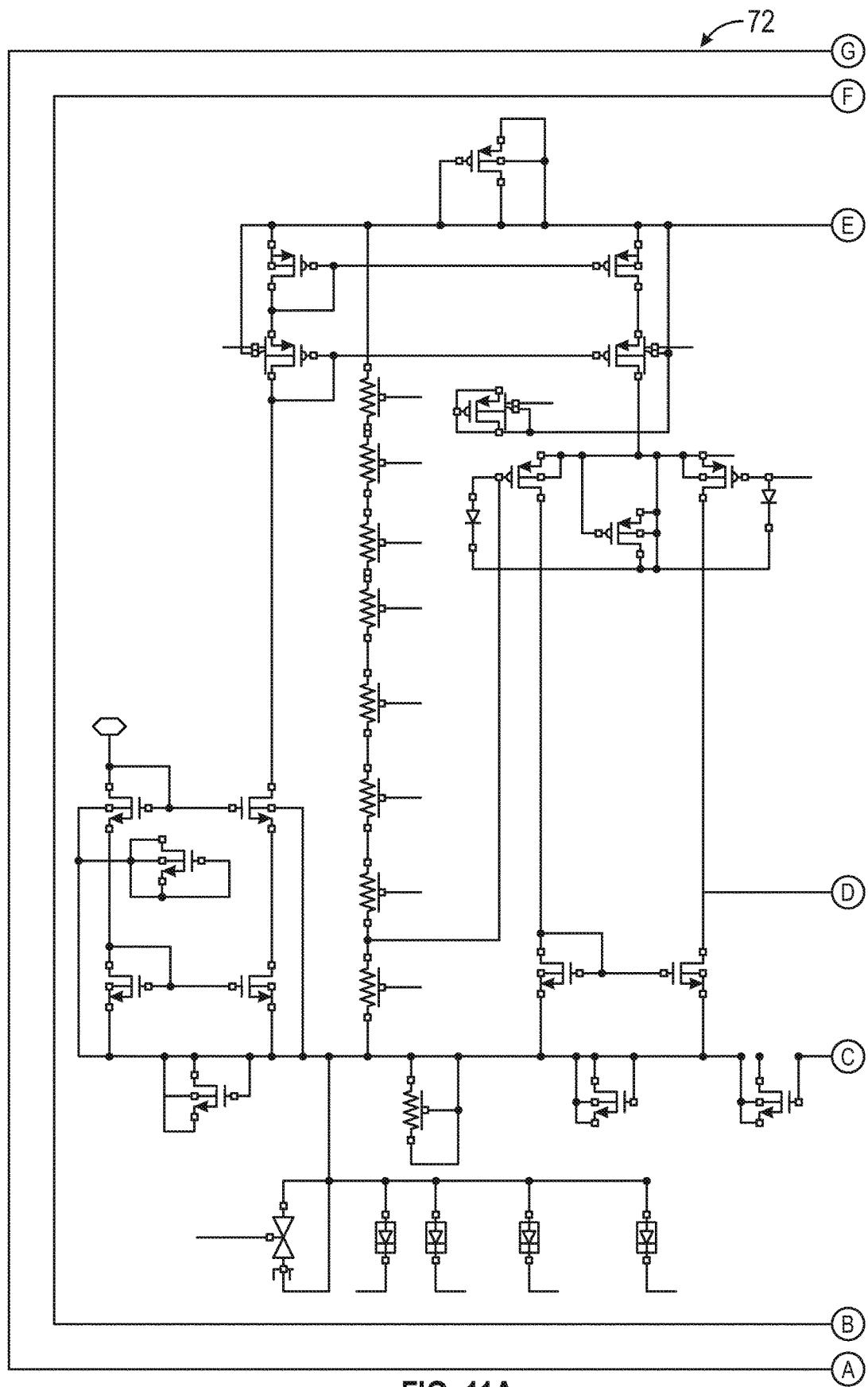
FIGS. 11A-C are schematics of a phase sense circuit implementation.
Figure 11B:
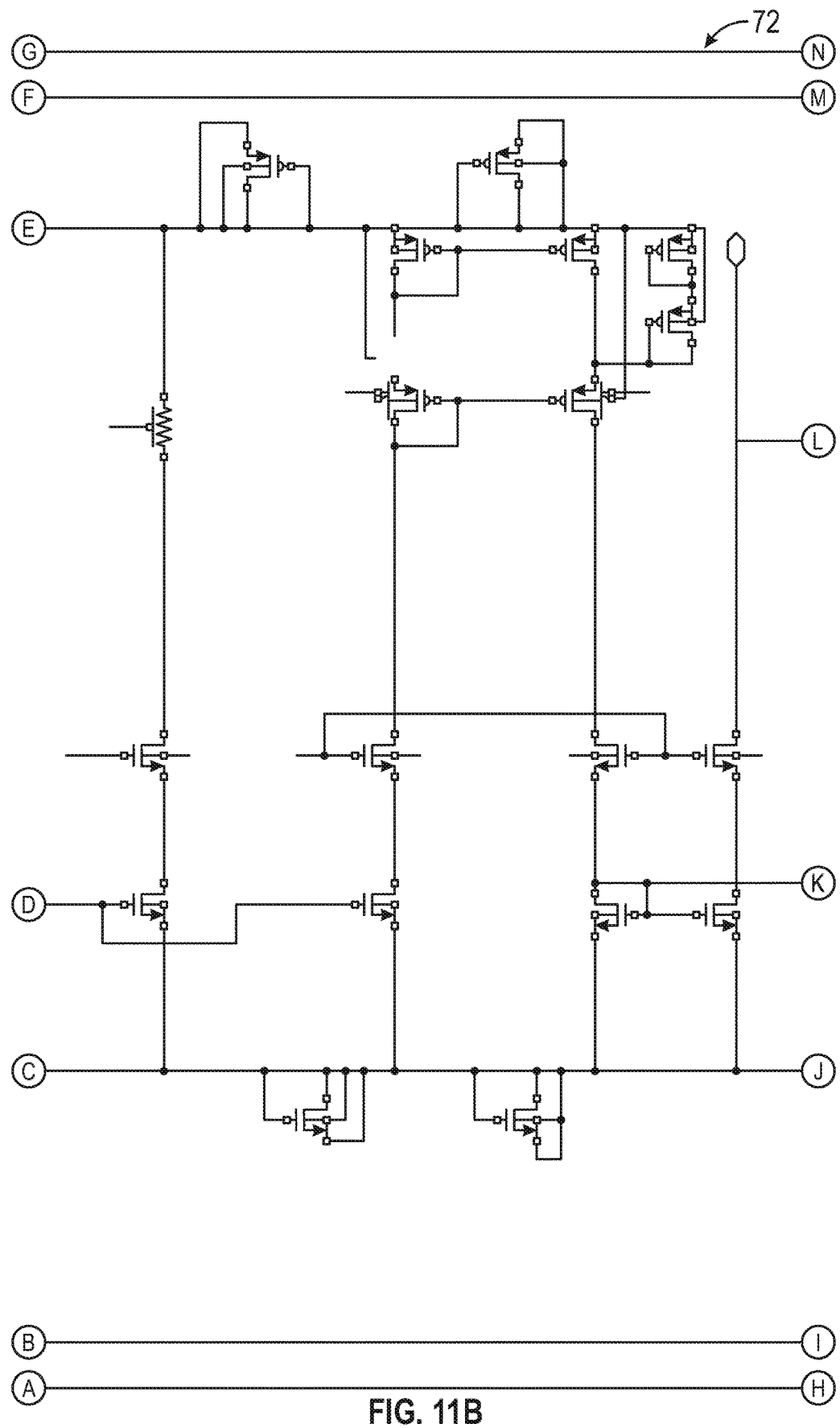
Figure 11C:
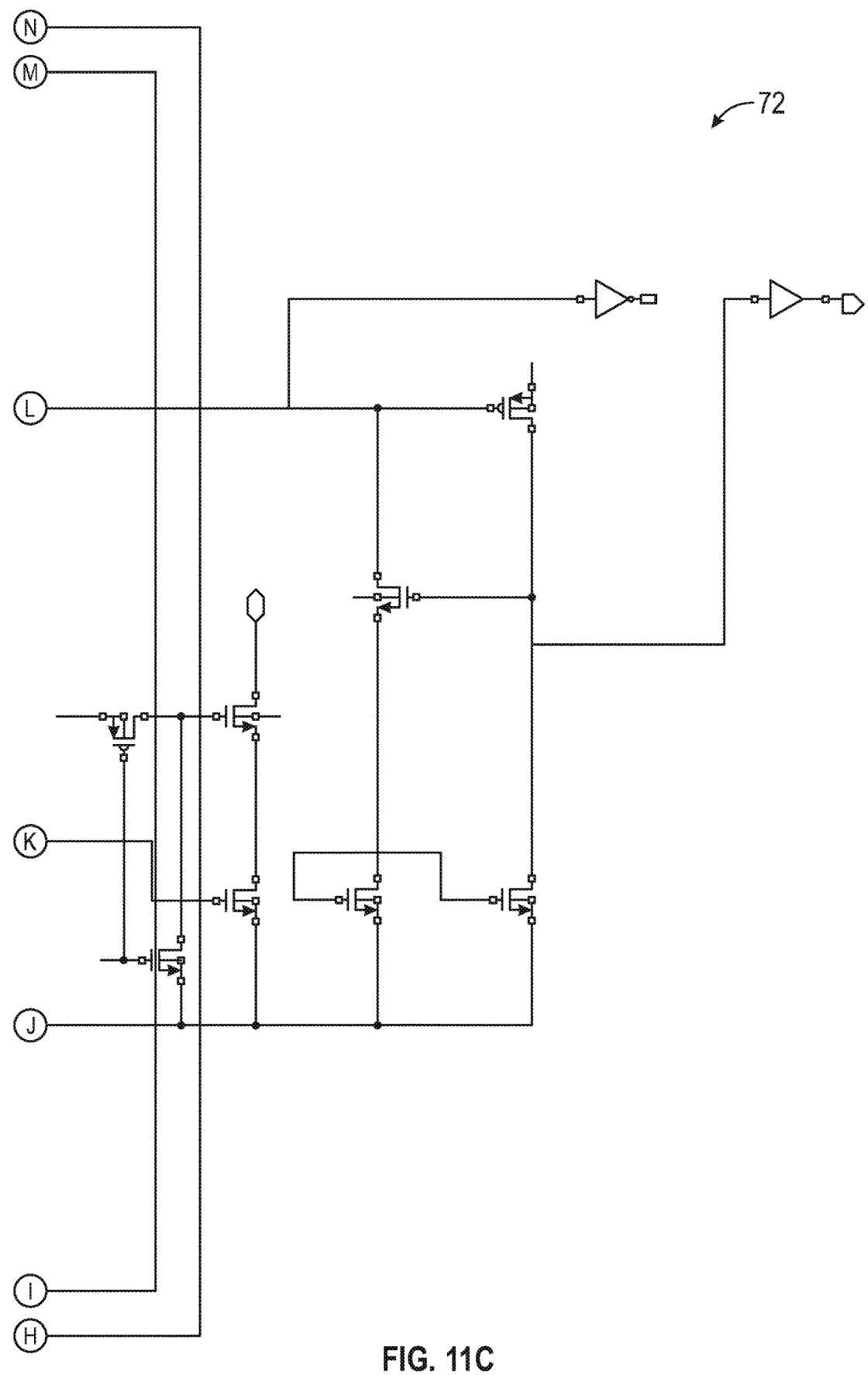
Figure 13:
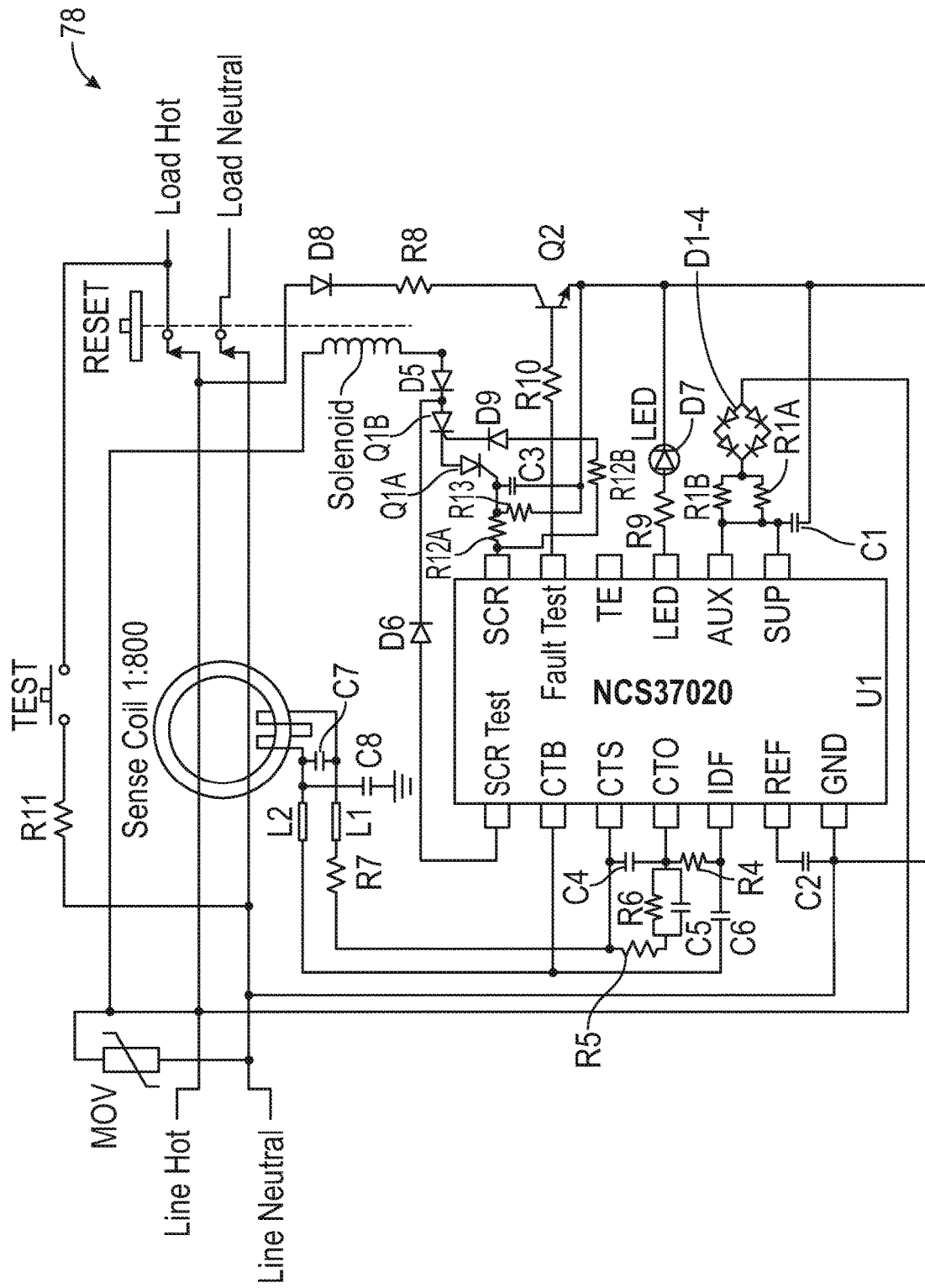
FIG. 13 is a schematic of an implementation of an ALCI circuit designed for use with a phase sense circuit implementation.

Referring to FIG. 11, an implementation of such a phase sensing circuit 72 is illustrated. The phase sensing circuit illustrated is implemented in the design of the 12 V shunt regulator itself. This circuit not only clamps the SUP pin 70 to approximately 12 V but also generates a clock related to the AC main phase that is used as phase information. Using the phase information, the sensing circuit monitors the behavior and output of the 12 V shunt regulator and is able to use that information to determine the AC zero cross point and time the firing of the SCR. FIG. 13 illustrates an ALCI circuit implementation 78 where no phase pin is present and the structure of the sense circuit is included in the controller itself.

Figure 12:
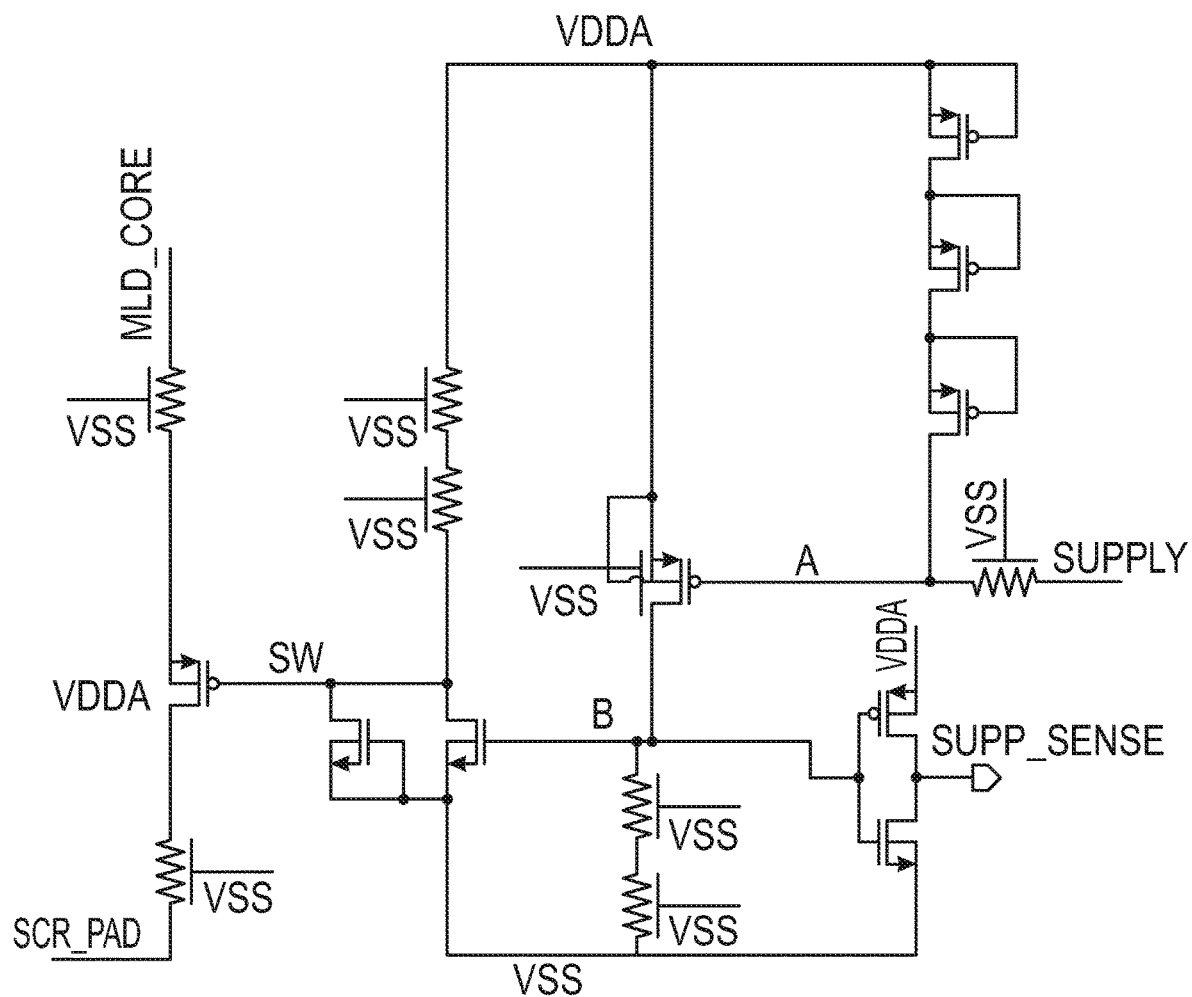
FIG. 12 is a schematic of an implementation of a supply sense circuit.
Figure 14:
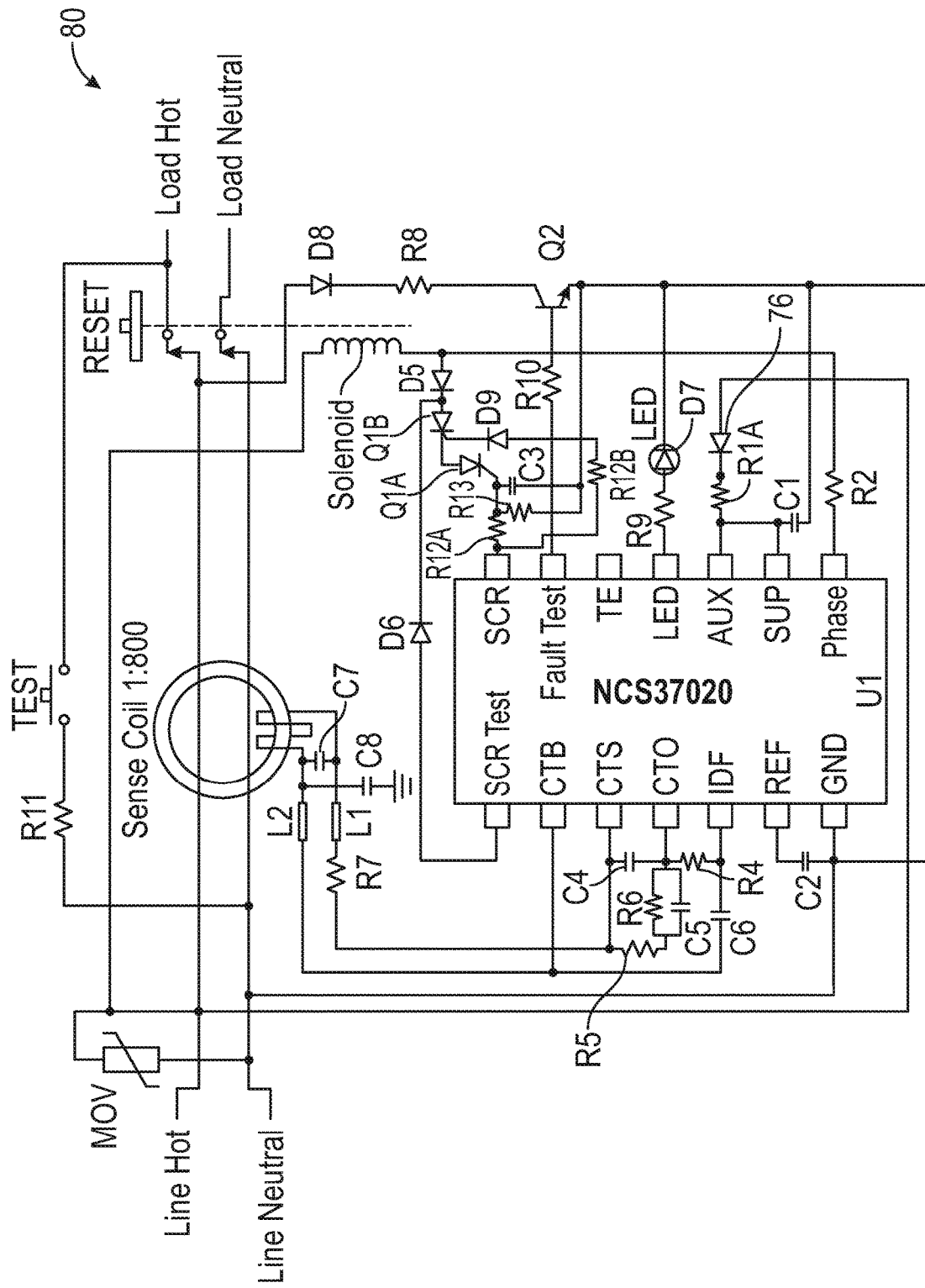
FIG. 14 is a schematic of an implementation of an ALCI circuit designed for use with a supply sense circuit implementation.

In various implementations, the requirement of the UL943/943B standard that an open condition on the power supply pin 70 be detected by the controller may be accomplished through use of the Phase pin. Referring to FIG. 12, an implementation of a power supply sensing circuit/supply sensing circuit 74 is illustrated. In the implementation illustrated in FIG. 12, the supply sensing circuit 74 is coupled with the Phase pin 26, the SCR pin 30, a VDDA source (an internal 3.3 V regulator), and the SUP pin 70. The power sensing circuit 74 is designed to activate if the SUP pin is floating or has no good voltage bias being applied to it. Once activated, the power supply sensing circuit 74 opens a switch between the Phase pin and the SCR pin which routes current supplied to the Phase pin 26 by the VDDA source to turn on the SCR connected to the SCR pin 30. The result of the use of the power sensing circuit 74 is that, as illustrated in the circuit implementation 80 of FIG. 14 and comparing with FIG. 2, the need for resistor and diode redundancy for the SUP pin can be eliminated allowing the resistors R1A and R1B to be replaced with single resistor R1A in FIG. 14 and diode 76. In this way the overall cost of the bill of materials for the ALCI circuit can be reduced by reducing the total number of components needed to carry out the open power supply pin monitoring.

In various implementations where supply sensing circuits like the one illustrated in FIG. 12 that use the Phase pin to assist in monitoring the SUP pin, no further need for a redundant power supply pin (the AUX pin) on the package may exist. Accordingly, through use of the power supply sensing circuit, the AUX pin can be eliminated from the package, thereby correspondingly reducing the package size and cost of manufacture. Therefore, in particular implementations where supply sensing circuits are employed, no AUX pin may be present in the package design.

While the implementations disclosed herein, disclose particular voltages, times, and numbers of repetitions, it is understood that the voltage amounts, times, and/or number of repetitions may be more or less than the voltages, times, and/or numbers disclosed for the particular implementations herein.

In places where the description above refers to particular implementations of various ground fault interrupt circuits, controllers, and implementing components, sub-components, methods and sub-methods, it should be readily apparent that a number of modifications may be made without departing from the spirit thereof and that these implementations, implementing components, sub-components, methods and sub-methods may be applied to other ground fault interrupt circuits, controllers, and implementing components.

What is claimed is:

1. A ground fault circuit interrupter self-test circuit comprising:
   a current transformer coupled to a controller;
   a silicon controlled rectifier (SCR) test loop coupled to the controller;
   a ground fault test loop coupled to the controller; and
   a solenoid coupled to the controller;
   wherein the SCR test loop is configured to conduct an SCR self-test during a first half wave portion of a phase and the ground fault test loop is configured to conduct a ground fault self-test during a second half wave portion of a phase;
   wherein an SCR is configured to activate the solenoid to deny power to a load upon one of the SCR self-test or the ground fault self-test being identified as failing; and
   wherein one of the ground fault self-test or the SCR self-test fails two or more consecutive times before the SCR activates the solenoid.

2. The circuit of claim 1, wherein the circuit is half wave biased.

3. The circuit of claim 1, wherein the circuit is configured to periodically test one of the current transformer, the solenoid, a rectifier diode circuit, a current limiter dropping resistor, or any combination thereof.

4. The circuit of claim 1, wherein the circuit is configured to detect an AC zero cross condition using a phase sense circuit coupled with a half wave power supply to monitor a power supply pin current over a positive half cycle and a negative half cycle of the half wave power supply.

5. The circuit of claim 1, wherein the circuit is configured to detect an open condition on a power supply pin using a supply sense circuit coupled with a switch coupled with a phase pin to turn on the SCR and activate the solenoid when the supply sense circuit detects a floating condition or a no good bias condition at the power supply pin.

6. The circuit of claim 5, wherein the supply sense circuit comprises a single diode coupled with a limiting resistor, the limiting resistor coupled with the power supply pin.

7. A ground fault interrupter self-test circuit comprising:
   a silicon controlled rectifier (SCR) test loop coupled to a controller;
   a ground fault test loop coupled to the controller; and
   a solenoid coupled to the controller;
   wherein the SCR test loop is configured to conduct an SCR self-test during a first half wave portion of a phase and the ground fault test loop is configured to conduct a ground fault self-test during a second half wave portion of a phase; and
   wherein an SCR is configured to activate the solenoid and deny power to a load upon one of the SCR self-test or the ground fault self-test being identified as failing two or more consecutive times.

8. The circuit of claim 7, wherein the circuit is half wave biased.

9. The circuit of claim 7, wherein one of the ground fault self-test or the SCR self-test are repeatedly performed after passage of a predetermined period of time while the circuit is coupled with an electrical power supply.

10. The circuit of claim 7, wherein the circuit is configured to periodically test one of a current transformer, the solenoid, a rectifier diode circuit, a current limiter dropping resistor, or any combination thereof.

11. The circuit of claim 7, wherein the circuit is configured to detect an AC zero cross condition using a phase sense circuit coupled with a half wave power supply to monitor a power supply pin current over a positive half cycle and a negative half cycle of the half wave power supply.

12. The circuit of claim 7, wherein the circuit is configured to detect an open condition on a power supply pin using a supply sense circuit coupled with a switch coupled with a phase pin to turn on the SCR and activate the solenoid when the supply sense circuit detects a floating condition or a no good bias condition at the power supply pin.

13. The circuit of claim 12, wherein the supply sense circuit comprises a single diode coupled with a limiting resistor, the limiting resistor coupled with the power supply pin.

14. A method of self-testing a ground fault interrupter circuit comprising:
   consecutively testing for a ground fault in a ground fault interrupter circuit during a first half wave portion of a phase;

consecutively testing a silicon controlled rectifier (SCR) in the ground fault interrupter circuit during a second half wave portion of the phase; and placing the ground fault interrupter circuit in an end of life stage if one of testing for the ground fault or testing the SCR results in consecutively failed tests.

15. The method of claim 14, wherein the testing for the ground fault and the testing of the SCR occur within a second of powering the ground fault interrupter circuit.

16. The method of claim 15, wherein the testing for the ground fault and the testing of the SCR is completed within five seconds of powering the ground fault interrupter circuit.

17. The method of claim 14, further comprising placing the ground fault interrupter circuit in the end of life stage if one of testing a current transformer, a solenoid, a rectifier diode circuit, a current limiter dropping resistor, or any combination thereof results in a failed test.

18. The method of claim 14, further comprising detecting an AC zero cross condition using a phase sense circuit coupled with a half wave power supply to monitor a power supply pin current over a positive half cycle and a negative half cycle of the half wave power supply.

19. The method of claim 14, further comprising detecting an open condition on a power supply pin using a supply sense circuit coupled with a switch coupled with a phase pin to turn on the SCR and activate a solenoid when the supply sense circuit detects a floating condition or a no good bias condition at the power supply pin.

* * * * *